United States Patent [19]

Chang

[11] Patent Number: 6,038,788

[45] Date of Patent: Mar. 21, 2000

[54] CHUCK ASSEMBLY WITH A CONTAMINATION PREVENTION DEVICE FOR A SEMICONDUCTOR WAFER TRANSFER APPARATUS

[75] Inventor: Sung-Hun Chang, Suwon, Rep. of Korea

[73] Assignee: Samsung Electronics Co., Ltd., Suwon, Rep. of Korea

[21] Appl. No.: 08/867,736

[22] Filed: Jun. 3, 1997

[30] Foreign Application Priority Data

Jun. 4, 1996 [KR] Rep. of Korea .................. 96-19736

[51] Int. Cl.[7] ........................................ F26B 3/00
[52] U.S. Cl. ........................ 34/443; 432/239; 34/107
[58] Field of Search ............................ 414/937–940; 34/68, 76, 443

[56] References Cited

U.S. PATENT DOCUMENTS

| | | |
|---|---|---|
| 5,178,639 | 1/1993 | Nishi ........................... 29/25.02 |
| 5,447,294 | 9/1995 | Sakata et al. ................ 432/239 X |
| 5,628,121 | 5/1997 | Brooks et al. ................. 34/68 X |
| 5,671,119 | 9/1997 | Huang et al. ................... 361/234 |

Primary Examiner—Henry Bennett
Assistant Examiner—Malik N. Drake
Attorney, Agent, or Firm—Jones Volentine, L.L.P.

[57] ABSTRACT

A wafer transfer apparatus used during the processes of manufacturing semiconductor devices has a chuck assembly which includes at least a pair of retainers for accommodating a group of wafers, each wafer retainer having a wafer guide with a plurality of slots formed at regularly spaced intervals and a guide supporter for supporting the wafer guide. At least one nozzle is formed on the wafer guide and is connected to a gas supply member for supplying gas. When the chuck assembly moves downwardly so as to load wafers into a quartz boat, the nozzle sprays the gas so that quartz particles deposited in the slots can be blown off, thereby preventing contamination.

16 Claims, 6 Drawing Sheets

CHUCK ASSEMBLY WITH A CONTAMINATION PREVENTION DEVICE FOR A SEMICONDUCTOR WAFER TRANSFER APPARATUS

BACKGROUND OF THE INVENTION

1. Field of the Invention

The present invention relates to a chuck assembly for a wafer transfer apparatus used during the processes of manufacturing semiconductor devices, and more particularly to a chuck assembly for an automatic wafer transfer apparatus equipped with contamination prevention means.

2. Background of the Related Art

As shown in FIG. 1, the prior art automatic wafer transfer apparatus uses a chuck assembly 1 to remove a group of wafers 10 from a quartz boat 30 that has been unloaded from a process chamber and deliver them into a wafer cassette 40, and to remove the group of wafers from the wafer cassette and deliver them into the quartz boat.

The chuck assembly 1 comprises at least a pair of wafer retainers 20a and 20b for accommodating the group of wafers 10. Each of the wafer retainers 20a and 20b comprises a wafer guide 21a or 21b and a guide supporter 22a or 22b attached to the wafer guide 21a or 21b. The wafer guides 21a and 21b face each other.

As shown in FIG. 2, a plurality of slots 23 for accommodating the group of wafers 10 are formed at regularly spaced intervals in the facing sides of wafer guides 21a and 21b. Similar slots (not shown) are formed inside quartz boat 30, as is well known in the art. Also, as shown in FIG. 3, a plurality of slots 41 are formed at regularly spaced intervals inside the wafer cassette 40 to thereafter transport a group of wafers 10 to the subsequent process step.

Referring again to FIG. 1, the chuck assembly 1 for an automatic wafer transfer apparatus operates as follows to move wafers 10 to and from quartz boat 30 and wafer cassette 40. First, chuck assembly 1 moves downwardly to a quartz boat 30 (or wafer cassette 40) to retrieve wafers 10 therein. Next, the chuck assembly 1 holding the wafers 10 moves upwardly and horizontally into position over an empty wafer cassette 40 or quartz boat 30. And then, the chuck assembly 1 moves downwardly to load the wafers 10 into the wafer cassette 40 or quartz boat 30 without scratching the wafers 10.

However, in this conventional art, when wafers are retrieved from a quartz boat, quartz particles are produced and deposited inside the slots of the quartz boat due to contact between the wafers and the quartz boat. These particles are disturbed and become airborne when the next wafers are loaded into the quartz boat and these next wafers become contaminated with the particles. In addition, the particles are carried up into the slots 23 in the wafer guide and may become lodged therein.

SUMMARY OF THE INVENTION

It is therefore an object of the present invention to provide an automatic wafer transfer apparatus capable of preventing wafers from being contaminated by particles produced when wafers are loaded into a quartz boat or retrieved therefrom.

This and other objects of the present invention are achieved by using a wafer transfer apparatus comprising: a pair of wafer retainers for accommodating a group of wafers, each wafer retainer comprising a wafer guide having a plurality of slots formed at regularly spaced intervals on an inside surface of the wafer guide and a guide supporter abutting an outside surface of the wafer guide; and a means for preventing quartz particles deposited on the quartz boat from contaminating the wafers which are then loaded onto the quartz boat.

The means for preventing comprises at least one nozzle formed on the wafer guide; a gas supply member for supplying gas; and a gas delivery member connecting the gas supply member to the nozzle, for delivering gas from the gas supply member to the nozzle. The nozzle may be formed on the lower portion of the wafer guide, near where the wafer guide most closely approaches the quartz boat and wafer cassette.

The wafer transfer apparatus further comprises a valve, which is formed on the gas delivery member, for controlling the flow of gas; and a valve control for controlling the opening and closing of the valve.

The wafer transfer apparatus further comprises a gas filter on the gas delivery member. The gas may be air or nitrogen, or similar gas. The valve may be a solenoid valve and the nozzle may be formed inside the slot.

The nozzle may be formed as a passageway extending through the wafer guide, from its outside surface which abuts the guide supporter, through to its inside surface which forms the bottom of the plurality of slots. This passageway may extend through the wafer guide at an angle of about 40 to 50 degrees (preferably 45 degrees), the angle being inclined toward an outside edge of the wafer guide. The nozzle is positioned such that the gas blown out through the nozzle blows through the slot toward the quartz boat.

The wafer transfer apparatus is capable of preventing wafers from being contaminated by quartz particles, by jetting gas and blowing off quartz particles which may have been deposited into the slots.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings illustrate an embodiment of the invention, in which.

DETAILED DESCRIPTION OF PREFERRED EMBODIMENT

Figure 1:
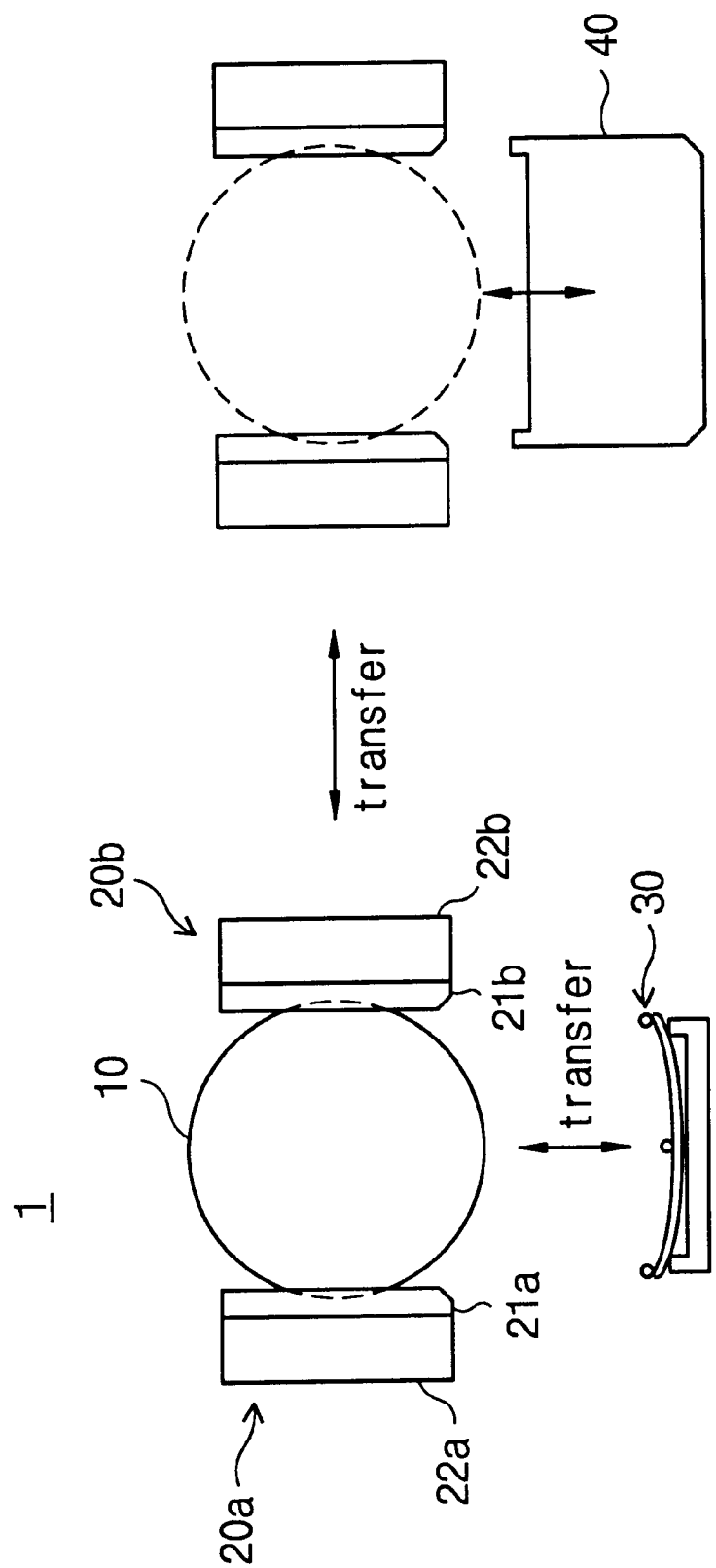
FIG. 1 is a diagram schematically depicting the structure and transfer function of a conventional wafer transfer apparatus.
Figure 2:
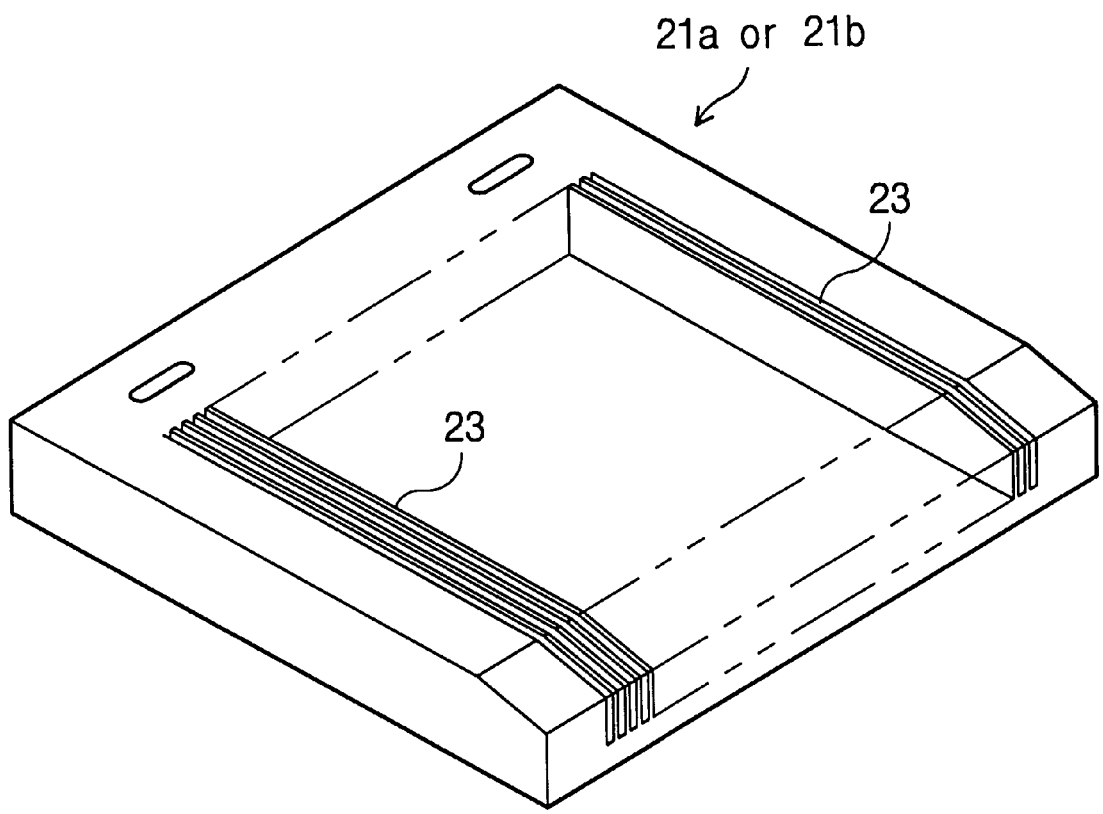
FIG. 2 is a perspective view showing additional details of the structure of a conventional wafer guide of the wafer transfer apparatus of FIG. 1.
Figure 3:
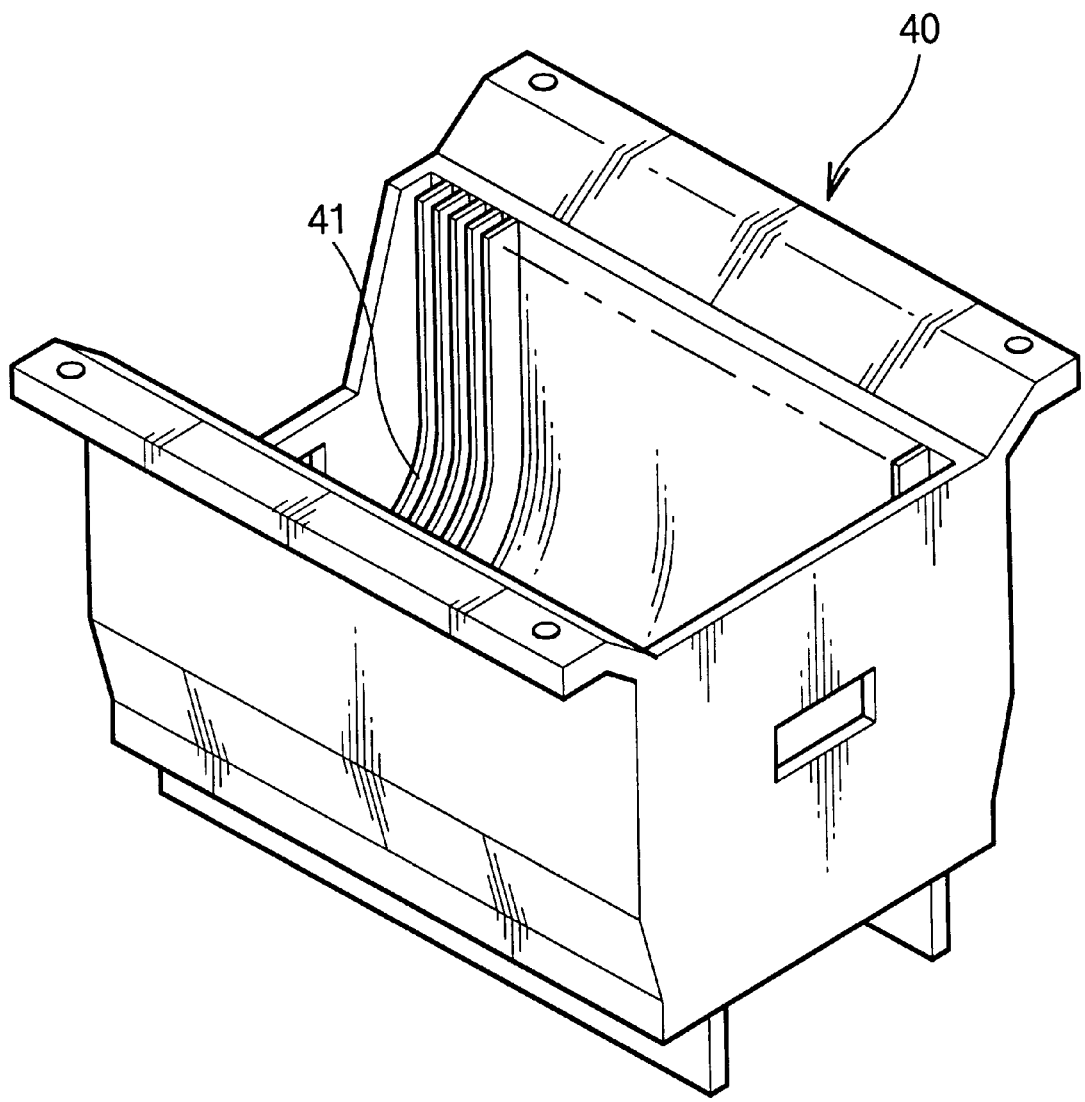
FIG. 3 is a perspective view showing additional details of the structure of a conventional wafer cassette of the wafer transfer apparatus of FIG. 1.
Figure 4:
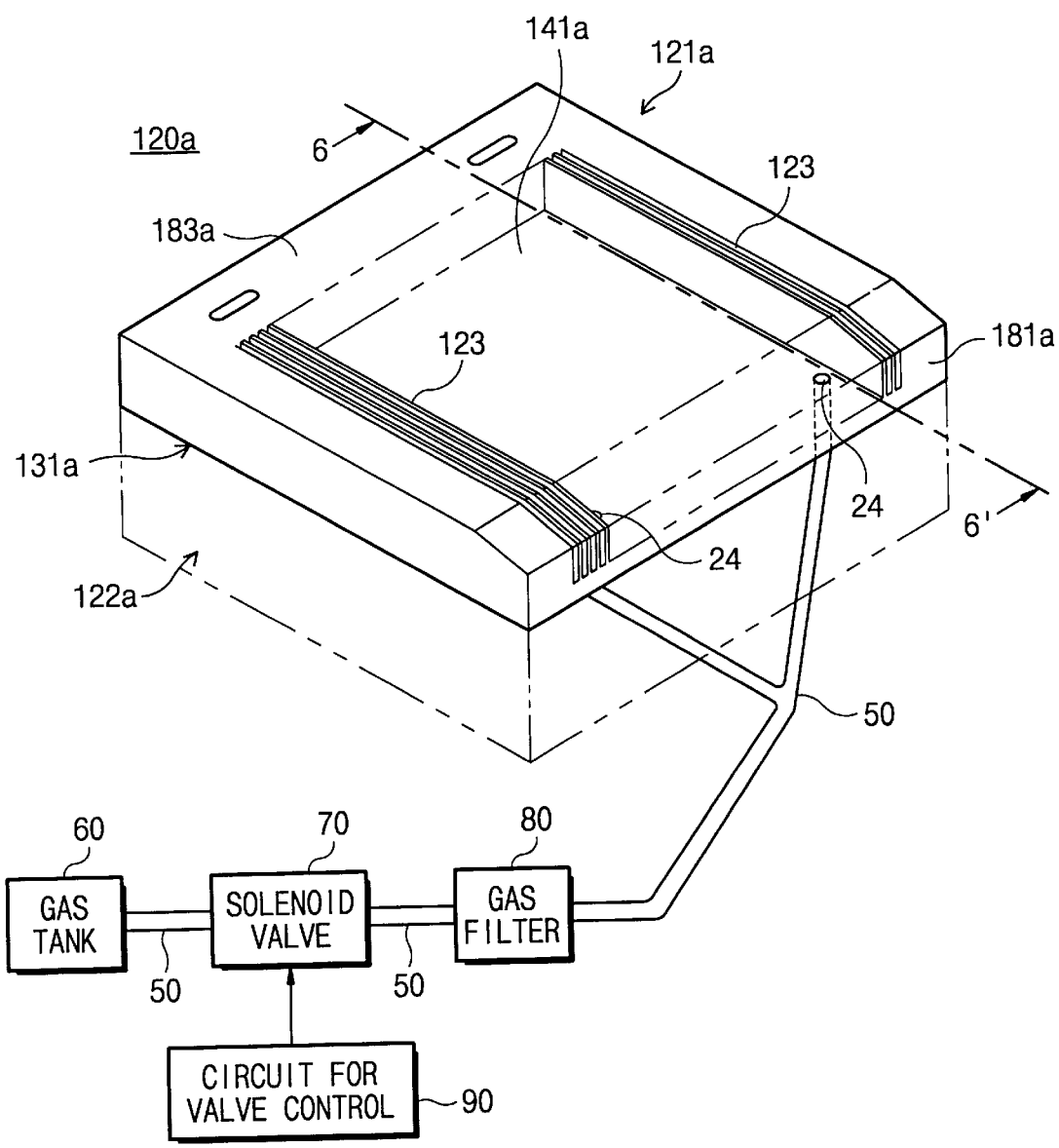
FIG. 4 is a diagram schematically depicting the structure of a wafer guide and organization of the peripheral devices in accordance with an embodiment of the present invention.
Figure 5:
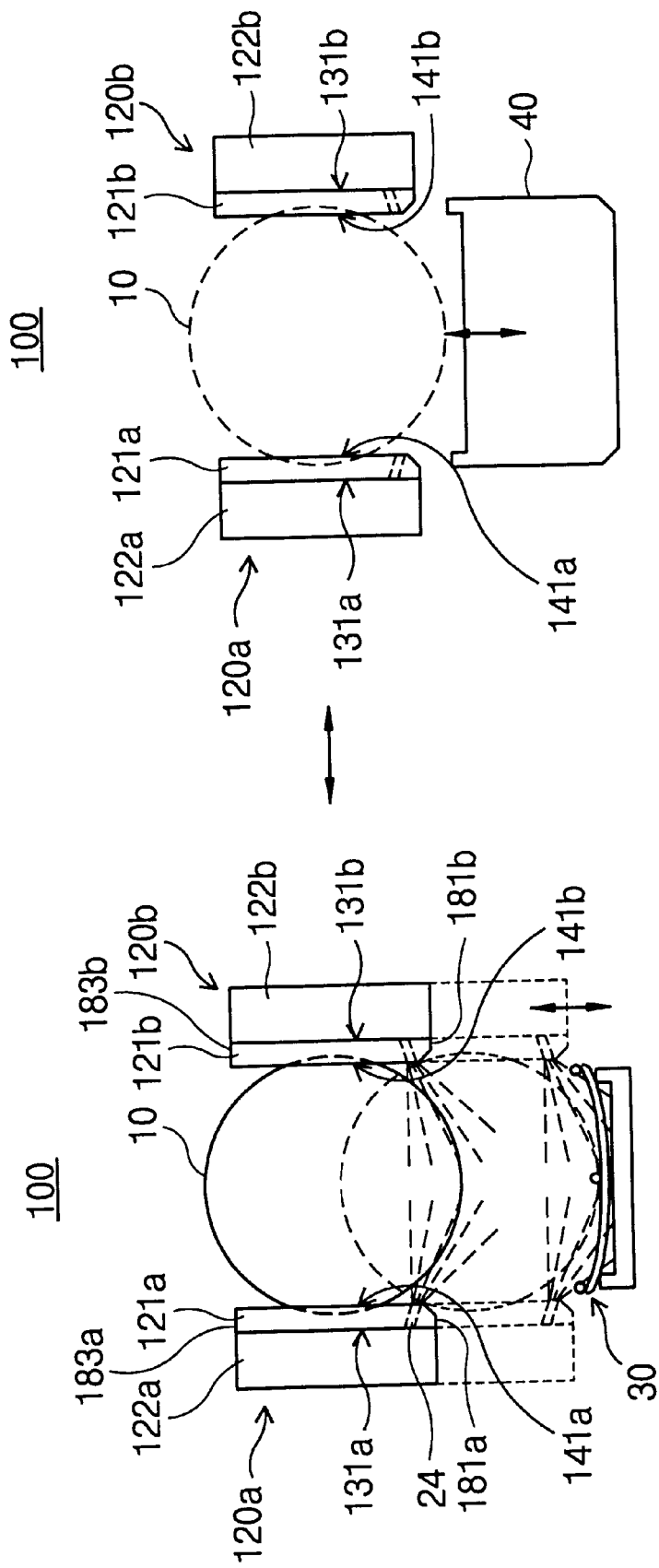
FIG. 5 is a diagram schematically depicting the structure and transfer function of the wafer transfer apparatus in accordance with an embodiment of the present invention.

A preferred embodiment will be described in detail with reference to FIGS. 4 and 5. A wafer transfer apparatus according to the present invention, as shown in FIGS. 4 and 5, uses a chuck assembly 100 comprising at least a pair of wafer retainers 120a and 120b for accommodating a group of wafers 10. Each wafer retainer 120a and 120b includes a wafer guide 121a or 121b, and a guide supporter 122a or 122b attached to wafer guide 121a or 121b. Each wafer guide 121a or 121b has an outside surface 131a or 131b which abuts the guide supporter 122a or 122b, and an inside surface 141a or 141b. The inside surfaces 141a and 141b of each wafer guide 121a or 121b are equipped with a plurality of slots 123 formed at regularly spaced intervals for accommodating wafers 10, as shown in FIG. 4, and at least one pair of nozzles 24 for jetting gas, formed on the inside surface 141a or 141b inside the slots 123. The nozzle 24 sprays gas when the chuck assembly 100 moves downwardly so as to load wafers 10 into a quartz boat 30. As a result, any quartz particles, which may have been produced when wafers were loaded or retrieved from the quartz boat and which may have been deposited on the quartz boat 30, or may have been transferred to slots 123 by the wafers, are thereby blown out of the slots (not shown) of the quartz boat 30 and out of slots 123. The pair of wafer guides 121a and 121b are generally coated with Teflon. Alternatively, a nozzle 24 for jetting gas may be formed within each of the slots 123.

Figure 6:
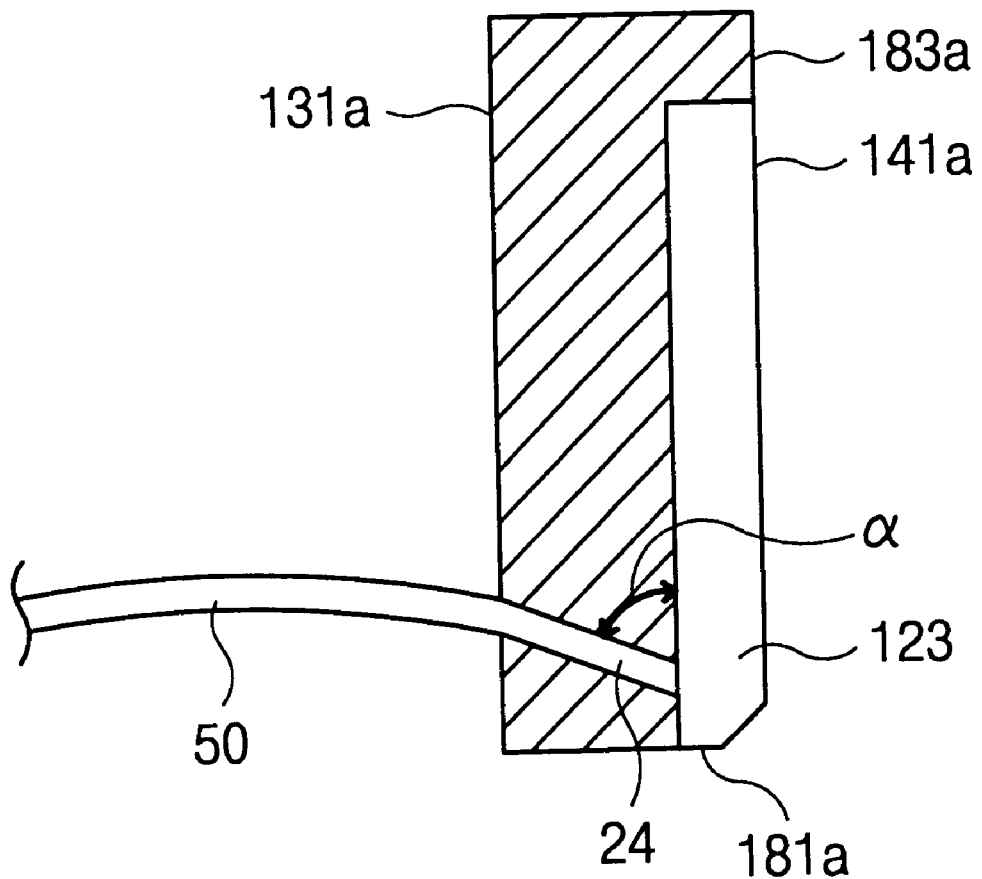
FIG. 6 is a cross section view of the wafer guide of FIG. 4, taken along the line 6–6'.

With reference to FIGS. 4, 5, and 6, each nozzle 24 may be formed as a passageway extending through the wafer guide 121a or 121b from its outside surface 131a or 131b through to its inside surface 141a or 141b. This passageway may extend through the wafer guide at an angle α of about 40 to 50 degrees (preferably 45 degrees). As shown best in FIG. 6, the angle α is inclined toward an outside edge 181a or 181b of the wafer guide. Numerals 183a or 183b define the inside edge of the wafer guide. The nozzle 24 is positioned such that the gas blown out through the nozzle blows through the slot 123 in the direction of the wafers 10 and quartz boat 30.

The nozzle 24 is linked to a flexible tube 50 used as a gas delivery member, which is connected to a gas tank 60. The tube 50 is linked to a solenoid valve 70 and a gas filter 80. The solenoid valve 70, which is under the control of a circuit for valve control 90, is responsible for the delivery of gas from the gas tank 60 to the nozzle 24 through the tube 50. The gas used is air or nitrogen, or the like.

Referring again to FIG. 5, the nozzle 24 sprays gas when the chuck assembly 100 moves downwardly so as to load wafers 10 into a quartz boat 30. As a result, quartz particles deposited on the quartz boat 30 are blown off, and any quartz particles which may have been transferred from the quartz boat 30 to the wafer guide 121a or 121b via the wafers 10 and become lodged in slots 123 of the wafer guide will also be blown out.

Therefore, the automatic transfer apparatus of the present invention is capable of preventing wafers from being contaminated with quartz particle by jetting gas and blowing off any particles which may have been deposited on the apparatus, thereby resulting in improved quality of the wafer product and improved yield.

While a preferred embodiment of the present invention has been described, it will be understood by those skilled in the art that various changes and modifications may be made, and equivalents may be substituted for elements thereof without departing from the true scope of the present invention. Therefore, it is intended that the present invention not be limited to the particular embodiment disclosed, but that the present invention include all embodiments falling within the scope of the appended claims.

What is claimed is:

1. A wafer transfer apparatus for transferring wafers to and from a quartz boat, comprising:

a pair of wafer retainers for accommodating a group of wafers, each wafer retainer comprising a wafer guide having a plurality of slots formed at regularly-spaced intervals on an inside surface of the wafer guide and a guide supporter abutting an outside surface of the wafer guide for supporting the wafer guide:

at least one nozzle formed on the wafer guide;

a gas supply member for supplying gas; and a gas delivery member, which is connected between the gas supply member and the nozzle, for delivering gas from the gas supply member to the nozzle to prevent particles deposited on the quartz boat from contaminating the wafers which are loaded into and retrieved from the quartz boat.

2. The wafer transfer apparatus of claim 1, wherein said nozzle is formed in close proximity to an outside edge of the wafer guide.

3. The wafer transfer apparatus of claim 1, further comprising:

a valve formed on the gas delivery member for controlling the flow of gas; and a valve control for controlling the opening and closing of the valve.

4. The wafer transfer apparatus of claim 3, further comprising a gas filter on the gas delivery member.

5. The wafer transfer apparatus of claim 4, wherein said valve is a solenoid valve.

6. The wafer transfer apparatus of claim 1, wherein said at least one nozzle is formed inside one of the plurality of slots.

7. The wafer transfer apparatus of claim 1, further comprising a plurality of nozzles, each of said plurality of nozzles formed inside respective ones of said plurality of slots.

8. The wafer transfer apparatus of claim 1, wherein said gas is one of air and nitrogen.

9. The wafer transfer apparatus of claim 1, wherein said at least one nozzle is formed as a passageway extending through the wafer guide, said passageway extending through the wafer guide at an angle of about 40 to about 50 degrees, said angle being inclined toward an outside edge of the wafer guide, such that the gas blown out through the nozzle blows through the slots toward the quartz boat.

10. The wafer transfer apparatus of claim 9, wherein said angle is 45 degrees.

11. The wafer transfer apparatus of claim 2, wherein said at least one nozzle is formed as a passageway extending through the wafer guide, said passageway extending through the wafer guide at an angle of about 40 to about 50 degrees, said angle being inclined toward the outside edge of the wafer guide, such that the gas blown out through the nozzle blows through the slots toward the quartz boat.

12. The wafer transfer apparatus of claim 11, wherein said angle is 45 degrees.

13. The wafer transfer apparatus of claim 6, wherein said at least one nozzle is formed as a passageway extending through the wafer guide, said passageway extending through the wafer guide at an angle of about 40 to about 50 degrees, said angle being inclined toward an outside edge of the wafer guide, such that the gas blown out through the nozzle blows through the slots toward the quartz boat.

14. The wafer transfer apparatus of claim 13, wherein said angle is 45 degrees.

15. The wafer transfer apparatus of claim 7, wherein said nozzles are formed as a passageways extending through the wafer guide, said passageways extending through the wafer guide at an angle of about 40 to about 50 degrees, said angle being inclined toward an outside edge of the wafer guide, such that the gas blown out through the nozzles blows through the slots toward the quartz boat.

16. The wafer transfer apparatus of claim 15, wherein said angle is 45 degrees.

* * * * *